United States Patent
Nguyen

(10) Patent No.: US 6,255,880 B1
(45) Date of Patent: Jul. 3, 2001

(54) ONE-SHOT DLL CIRCUIT AND METHOD

(75) Inventor: Andy T. Nguyen, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 09/493,858

(22) Filed: Jan. 28, 2000

Related U.S. Application Data

(63) Continuation-in-part of application No. 09/427,143, filed on Oct. 25, 1999.

(51) Int. Cl.$^7$ ............................................. H03H 11/26
(52) U.S. Cl. ..................... 327/277; 327/284; 327/149; 327/158; 327/161; 365/233; 375/376
(58) Field of Search ................................. 331/11, 12, 17, 331/25, 14, 40, DIG. 2; 365/233, 233.5, 189.07, 189.09; 375/371, 238, 239, 373–376; 327/269–271, 276–277, 147, 149, 284, 155–156, 158, 161

(56) References Cited

U.S. PATENT DOCUMENTS

| | | | |
|---|---|---|---|
| 5,245,637 | * 9/1993 | Gersbach et al. | 375/374 |
| 5,537,069 | * 7/1996 | Volk | 327/149 |
| 5,994,938 | * 11/1999 | Lesmeister | 327/277 |
| 6,040,472 | * 3/2000 | Martin | 327/175 |
| 6,100,735 | * 8/2000 | Lu | 327/158 |

OTHER PUBLICATIONS

Xilinx Application Note, "Using the Virtex Delay–Locked Loop", XAPP132, Oct. 21, 1998.

* cited by examiner

*Primary Examiner*—Timothy P. Callahan
*Assistant Examiner*—Minh Nguyen
(74) *Attorney, Agent, or Firm*—Lois D. Cartier

(57) ABSTRACT

A delay-lock loop (DLL) circuit and method that accept an input clock signal and a feedback clock signal, and provide the necessary additional delay to synchronize the feedback clock signal to the input clock signal. Unlike previous circuits and methods, a single synchronization step is sufficient, provided that the frequency of the input clock signal is stable. A circuit according to the invention includes an input clock terminal supplying an input clock signal, and a delay line driven by the input clock signal and supplying a plurality of intermediate clock signals delayed from the input clock signal by incremental unit delays. A clock multiplexer selects from among these intermediate clock signals, under control of a multiplexer control circuit, the clock signal that provides the necessary additional delay to synchronize the feedback clock signal to the input clock signal. The output clock signal from the clock multiplexer is distributed through the clock network to provide the distributed clock signal as well as the feedback clock signal.

12 Claims, 5 Drawing Sheets

ONE-SHOT DLL CIRCUIT AND METHOD

CROSS-REFERENCE TO RELATED APPLICATIONS

This application is a continuation-in-part application of commonly assigned, co-pending U.S. patent application Ser. No. 09/427,143 invented by Andy T. Nguyen, entitled "DUTY CYCLE CORRECTION CIRCUIT AND METHOD" and filed Oct. 25, 1999, which is incorporated herein by reference.

FIELD OF THE INVENTION

The invention relates to integrated circuits (ICs). More particularly, the invention relates to a delay-lock loop (DLL) circuit and method for an IC.

BACKGROUND OF THE INVENTION

Clock signals are used in virtually every IC and electronic system to control timing. For example, every time there is a rising edge on a clock signal, all the flip-flops in a circuit may change state. Clearly, clocks are often heavily loaded signals, and may be bussed throughout a very large IC. Even with specially-designed global buffers, there is typically a delay between the clock edge received by the IC at the pad, and the clock edge received by the last-served flip-flop on the IC (i.e., between the "input clock signal" and the "destination clock signal"). This delay, designated herein as $t_d$, may cause difficulties in interfacing between ICs, or simply slow down the overall system speed. Input data may be provided in synchronization with the input clock signal, while output data is typically provided in synchronization with the destination clock signal. Further, $t_d$ often varies not only between different ICs, but on a single IC with temperature and voltage as well. It is highly desirable to have a circuit and method for synchronizing a destination clock signal with an input clock signal, so that the destination clock signals of various ICs can be commonly synchronized by synchronizing each destination clock signal to a common input clock signal.

This clock synchronization procedure is often performed using a phase-lock loop (PLL) or delay-lock loop (DLL). However, known PLLs and DLLs consume a great deal of silicon area. Additionally, PLLs are often analog in nature and take an extremely long time to simulate, and a design that works in one manufacturing process may stop working when manufactured using another process. Further, analog PLLS can be particularly sensitive to radiation. Therefore, PLLS are very difficult to design, and often are not feasible in a given circuit or system. Known DLLS are also very complicated and difficult to design. Further, known DLLs require many input clock cycles to "lock", i.e., to synchronize a destination clock signal to an input clock signal. As described below, known DLLs also typically run continuously during the entire time the two clock signals must be synchronized, frequently adjusting the destination clock signal to keep it properly synchronized. This constant adjustment not only requires a large and complicated state machine, it also injects a lot of noise into the clock network. Because a noisy clock signal can cause enormous problems in a sensitive IC circuit, a large stabilizing capacitor is often required between the positive power supply (VDD) and the zero voltage level (ground). For one or more of these reasons, clock synchronization is often not feasible using known circuits and methods.

Therefore, it is desirable to provide a delay-lock loop circuit and method using a fairly simple circuit that consumes a relatively small amount of silicon area and locks in a few clock cycles.

SUMMARY OF THE INVENTION

The invention provides a delay-lock loop (DLL) circuit and method that accept an input clock signal and a feedback clock signal, and provide the necessary additional delay to synchronize the feedback clock signal to the input clock signal. Unlike previous circuits and methods, a single synchronization step is sufficient, provided that the frequency of the input clock signal is stable. A circuit according to the invention includes an input clock terminal supplying an input clock signal, and a delay line driven by the input clock signal and supplying a plurality of intermediate clock signals delayed from the input clock signal by incremental unit delays. A clock multiplexer selects from among these intermediate clock signals, under control of a multiplexer control circuit, the clock signal that provides the necessary additional delay to synchronize the feedback clock signal to the input clock signal, i.e., the clock signal subject to a delay about equal to (e.g., closest to but not exceeding) the delay needed to bring a first (e.g., rising) edge of the feedback clock signal into synchronization with the same (e.g., rising) edge of the input clock signal. The output clock signal from the clock multiplexer is distributed through the clock network to provide the distributed clock signal as well as the feedback clock signal. (In another embodiment, the intermediate clock signal selected by the clock multiplexer is the intermediate clock signal subject to a delay closest to and exceeding the delay needed to synchronize the feedback and input clock signals.)

The multiplexer control circuit essentially counts the number of unit delays between a first (e.g., rising) edge of the feedback clock signal and the same (e.g., rising) edge of the input clock signal. This delay period is the additional delay that must be added to the feedback clock to bring the two clock, into synchronization. This number is then used to select the correct intermediate clock signal.

In one embodiment, the DLL circuit includes an option to disable the circuit. A disable control signal is applied to t multiplexer control circuit to select the input clock signal the output clock signal. Therefore, when the DLL circuit is disabled, no adjustment of the feedback clock signal is performed.

In yet another embodiment, a status generator circuit is provided that provides a status signal after a predetermined number of input clock cycles have elapsed. This status signal may be used by other circuits to disable the output clock signal until the output clock signal has settled into a reliably predictable pattern.

An advantage of the invention is that once the two clocks are synchronized, they need not be resynchronized unless the frequency of the input clock signal changes. Although the feedback clock signal may not be exactly synchronized to the input clock signal (the degree of accuracy depending on the granularity of the unit delay compared to the measured delay), the offset between the two clock signals does not change with time, and no subsequent adjustments need be made, as with prior art DLL circuits. Therefore, the circuit and method of the invention inject significantly less noise into the IC than known methods. Further, this "one-shot" capability (i.e., the ability to synchronize the two clocks in a single synchronization step) means that the circuit of the invention is much easier to simulate, and thus to design, than known DLL circuits.

Another advantage of the invention is that the circuit is smaller and therefore less expensive to implement than known DLL circuits, because no large state machine is required. Therefore, using the DLL circuit of the invention, clock synchronization capability can be added to smaller and less expensive ICs than was previously feasible.

In one embodiment, the "one-shot" concept of the invention is applied to a conventional DLL, thereby reducing the number of clock cycles required to synchronize the global and local clocks. However, as in conventional DLLS, the feedback clock is still monitored and adjusted at each clock cycle to maintain a continuous check and synchronization.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Clock Network Delay

Figure 1A:
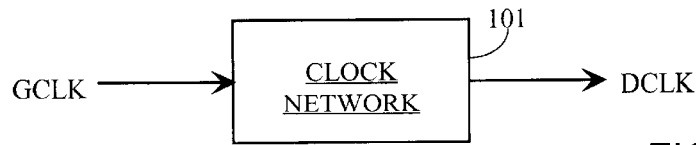
FIG. 1A is a simple block diagram of a global clock network, showing the input and output signals.
Figure 1B:
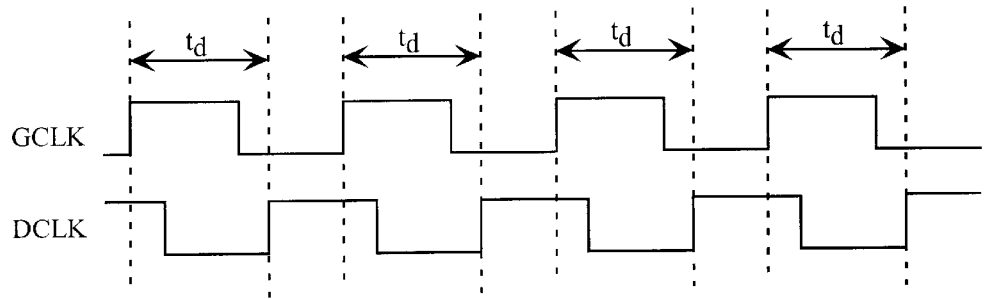
FIG. 1B is a timing diagram showing the interrelationship between the input and output signals of the global clock network of FIG. 1A.

FIG. 1A is a simple block diagram of a clock network 101 having an intrinsic delay, the diagram showing the input clock terminal GCLK and the output clock terminal DCLK. FIG. 1B shows the corresponding signals. (In the present specification, the same reference characters are used to refer to terminals, signal lines, and their corresponding signals.) As shown in FIG. 1B, the output clock signal DCLK has a frequency the same as that of the input clock signal GCLK, but delayed by a time $t_d$.

Note that FIG. 1B shows the rising edge of the DCLK signal occurring within the second half of the input clock period. Alternatively, the rising edge of the DCLK signal may occur during the first half of the input clock period, or the clock network delay may be longer than the input clock period, such that the rising edge of the DCLK signal occurs in either half of a subsequent input clock period, or simultaneously with a GCLK edge. The case where the rising edge of the DCLK signal occurs in the second half of the same input clock period is depicted herein in each of the figures, for consistency. It is understood that the other examples mentioned may be extrapolated from the pictured examples.

Prior Art DLLs

Figure 2A:
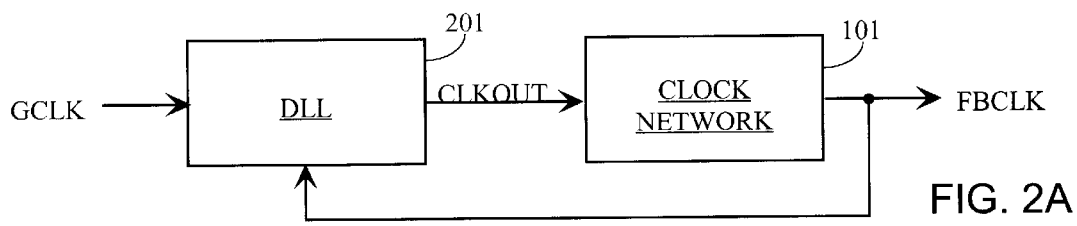
FIG. 2A is a simple block diagram showing how a DLL circuit is used to synchronize two clock signals, showing the input and output signals.
Figure 2B:
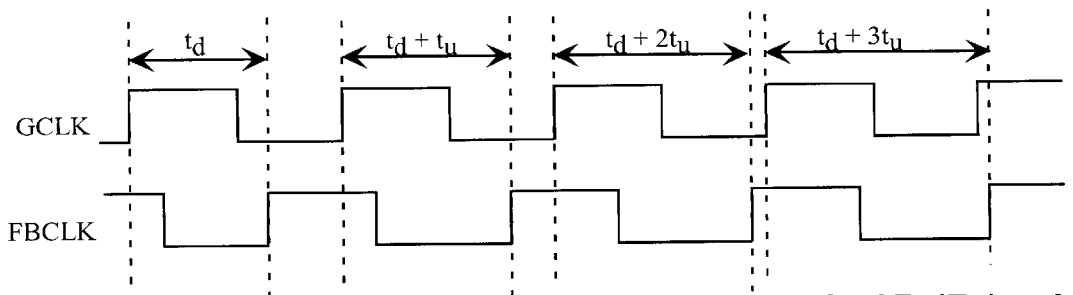
FIG. 2B is a timing diagram showing the interrelationships among the input and output signals when a prior art circuit and method are used to implement the DLL circuit of FIG. 2A.

FIG. 2A is a simple block diagram of a DLL circuit 201 and a clock network 101, the DLL being driven by both the input clock signal GCLK and the feedback clock FBCLK provided by the clock network 101. FIG. 2B shows the corresponding signals for a prior art DLL. (Note that FIG. 2B has been simplified as described below, for clarity.) During the first input clock cycle shown, feedback clock signal FBCLK is delayed from input clock signal GCLK by a time td. During the second input clock cycle shown, feedback clock signal FBCLK has been altered, such that it is delayed from input clock signal GCLK by a time td plus a single unit delay $t_u$. During the third input clock cycle shown, feedback clock signal FBCLK has been delayed from input clock signal GCLK by a time $t_d$ plus two unit delays, or $2t_u$. During the fourth input clock cycle shown, feedback clock signal FBCLK has been delayed from input clock signal GCLK by a time $t_d+3t_u$. Because the DLL circuit has "overshot its target", in a fifth input clock cycle (not shown) the delay on feedback clock signal FBCLK will be reduced to $t_d+2t_u$, then returned to $t_d+3t_u$, back to $t_d+2t_u$, and so forth in a continual adjustment process.

This adjustment process actually takes much longer than is shown in FIG. 2B. A typical DLL takes sufficiently long to determine the appropriate adjustment that many "extra" clock cycles are inserted between each adjustment. For example, it may take six clock cycles to perform an adjustment. Thus, only one unit delay can be added or subtracted for each six clock cycles. These extra clock periods have been omitted from FIG. 2B, for clarity.

Clearly, obtaining the correct adjustment for a feedback clock can be a time-consuming (or even perpetual) process, using known methods.

DLLs According to the Invention

Figure 2C:
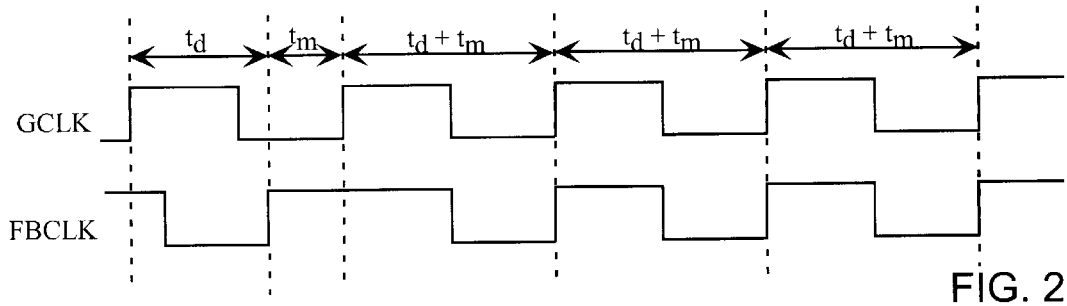
FIG. 2C is a timing diagram showing the interrelationships among the input and output signals when the circuit and method of the invention are used to implement the DLL circuit of FIG. 2A.

FIG. 2C shows the same signals as in FIG. 2B, but for a DLL implemented according to the circuit and method of the invention. During the first input clock cycle shown, feedback clock signal FBCLK is delayed from input clock signal GCLK by a time $t_d$. During this clock cycle, the correct delay $t_m$ for the feedback clock signal FBCLK is determined. Delay $t_m$ is any number of unit delays $t_u$ that synchronizes feedback clock FBCLK with the global clock GCLK. (If the clocks are the same as in FIG. 2B, then $t_m=2t_u$.) During the second input clock cycle shown, feedback clock signal FBCLK has been altered, such that it is delayed from input clock signal GCLK by a time $t_d+t_m$. During subsequent input clock cycles, feedback clock signal FBCLK does not alter; it has been "locked". No continual adjustment process is needed. Further, no "extra" clock cycles need be inserted.

FIRST EMBODIMENT

Figure 3:
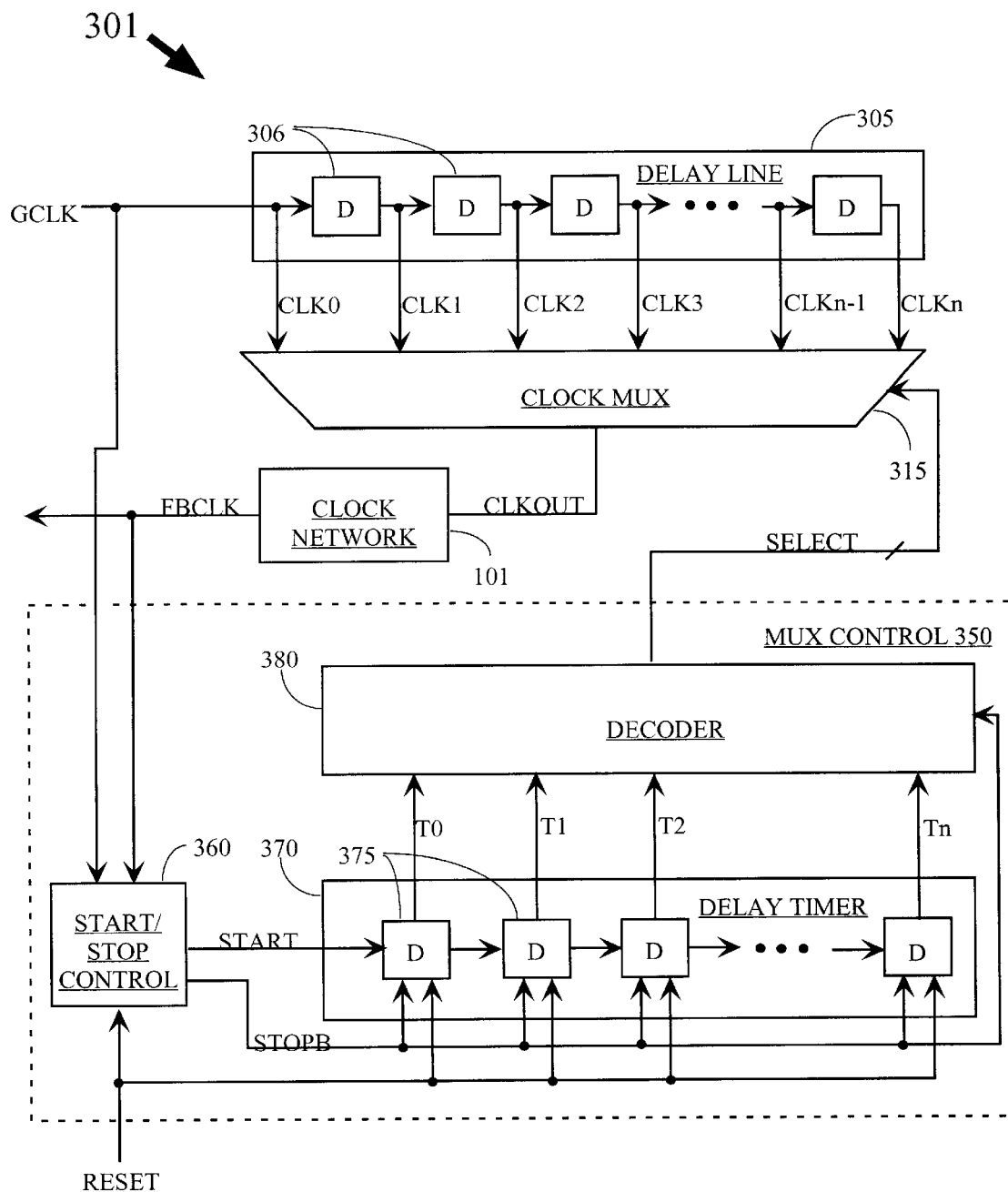
FIG. 3 is a block diagram of a first embodiment of the invention.

FIG. 3 shows a block diagram of a DLL circuit 301 according to one embodiment of the invention. The DLL circuit of FIG. 3 includes a delay line 305, a clock multiplexer 315, a clock network 101 (generally located external to the DLL, but pictured for clarity), and a multiplexer control circuit 350. An input clock signal GCLK drives delay line 305. Delay line 305 provides from input clock signal GCLK a plurality of intermediate clock signals (CLK0, CLK1, . . . , CLKn) to clock multiplexer 315, which selects one of the intermediate clock signals and provides the selected signal as signal CLKOUT to clock network 101. Clock network 101 provides a feedback clock signal FBCLK which drives both multiplexer control circuit 350 and other circuits in the IC. Clock multiplexer 315 is controlled by SELECT signals from multiplexer control circuit 350.

Delay line 305 comprises a series of delay elements 306, each having a delay of one "unit delay". A unit delay can be any period of time appropriate to the application of the DLL circuit. For example, a unit delay can be measured in tens, hundreds, or thousands of picoseconds, or even longer periods of time, particularly for non-IC applications. Delay line 305 provides a plurality of intermediate clock signals CLK0, CLK1, . . . , CLKn, respectively delayed by 0, 1, . . . , n unit delays from the input clock signal GCLK.

Clock multiplexer 315 (under control of multiplexer control circuit 350) selects the intermediate clock signal subject to the necessary additional delay to synchronize feedback clock signal FBCLK to input clock signal GCLK, i.e., the intermediate clock signal subject to a delay closest to but not exceeding the delay needed to bring a first (e.g., rising) edge of the feedback clock signal into synchronization with the same (e.g., rising) edge of the input clock signal. This selection process is described below.

Multiplexer control circuit 350 is responsible for selecting the correct intermediate clock signal to supply to the output clock generator. In the embodiment of FIG. 3, multiplexer control circuit 350 includes a Start/Stop control circuit 360, a delay timer circuit 370, and a decoder 380. Under control of Start/Stop control circuit 360, delay timer 370 counts the number of unit delays between a first (e.g., rising) edge of feedback clock signal FBCLK and the following same edge (e.g., the next rising edge) of input clock signal GCLK. Delay timer 370 thus determines the number of unit delays required to delay the feedback clock signal FBCLK and bring it into synchronization with the input clock signal GCLK. Using this information, decoder 380 supplies the select signals to clock multiplexer 315 to select the appropriate intermediate clock signal.

In one embodiment, Start/Stop control circuit 360 operates as follows. On the first rising edge of the FBCLK signal, the START signal goes high while the STOP signal remains low (i.e., the STOPB signal remains high). On the next rising edge of the GCLK signal, the STOP signal goes high (i.e., the STOPB signal goes low), and both START and STOP signals remain high until the circuit is reset. In one embodiment, the signals are reset by a reset signal received from outside the DLL circuit.

The START signal feeds into delay timer 370. All stages of delay timer 370 have a low value prior to the START signal going high. In one embodiment, this low value is assured by the same reset signal that is used to reset the START and STOP signals. When the START signal goes high, the high voltage level is passed along the delay chain (from left to right in FIG. 3). Each stage 375 of delay timer 370 has a delay of one unit delay, the same delay as in delay line 305, above. As long as the START signal is high and the STOP signal is low, i.e., for the period of time by which signal FBCLK should be delayed, one additional stage 375 of delay timer 370 goes high for each unit delay. For example, if the measured delay is m unit delays in length, then m stages 375 of delay timer 370 are high (starting from the left, i.e., bits T0, T1, . . . , Tm−1 are high) and the rest of the stages are low, when the STOP signal goes high and stops transmission of the START signal from left to right along the delay chain. In one embodiment, the STOPB signal is also used to disable the decoder 380 until the delay timer has completed the transmission of the START signal.

In one embodiment, delay timer circuit 370 is implemented as a simple counter. However, the use of a series of unit delays enables the delay through delay timer circuit 370 to closely track the delay through delay line 305. Therefore, in applications where such delays are process-dependent, as in integrated circuits, the illustrated implementations are preferred.

Decoder 380 receives the n+1 bits T0, T1, . . . , Tn from the delay timer. Of the bits with a high value, the most significant bit is identified and is used to select the correct intermediate clock signal.

In another embodiment (not shown), the intermediate clock signal selected by clock multiplexer 315 is the intermediate clock signal closest to and exceeding the delay needed to bring a first (e.g., rising) edge of the feedback clock signal into synchronization with the same (e.g., rising) edge of the input clock signal. In this embodiment, decoder 380 is simply modified to select the intermediate clock signal delayed by one unit delay compared to the previously described embodiment.

SECOND EMBODIMENT

Figure 4:
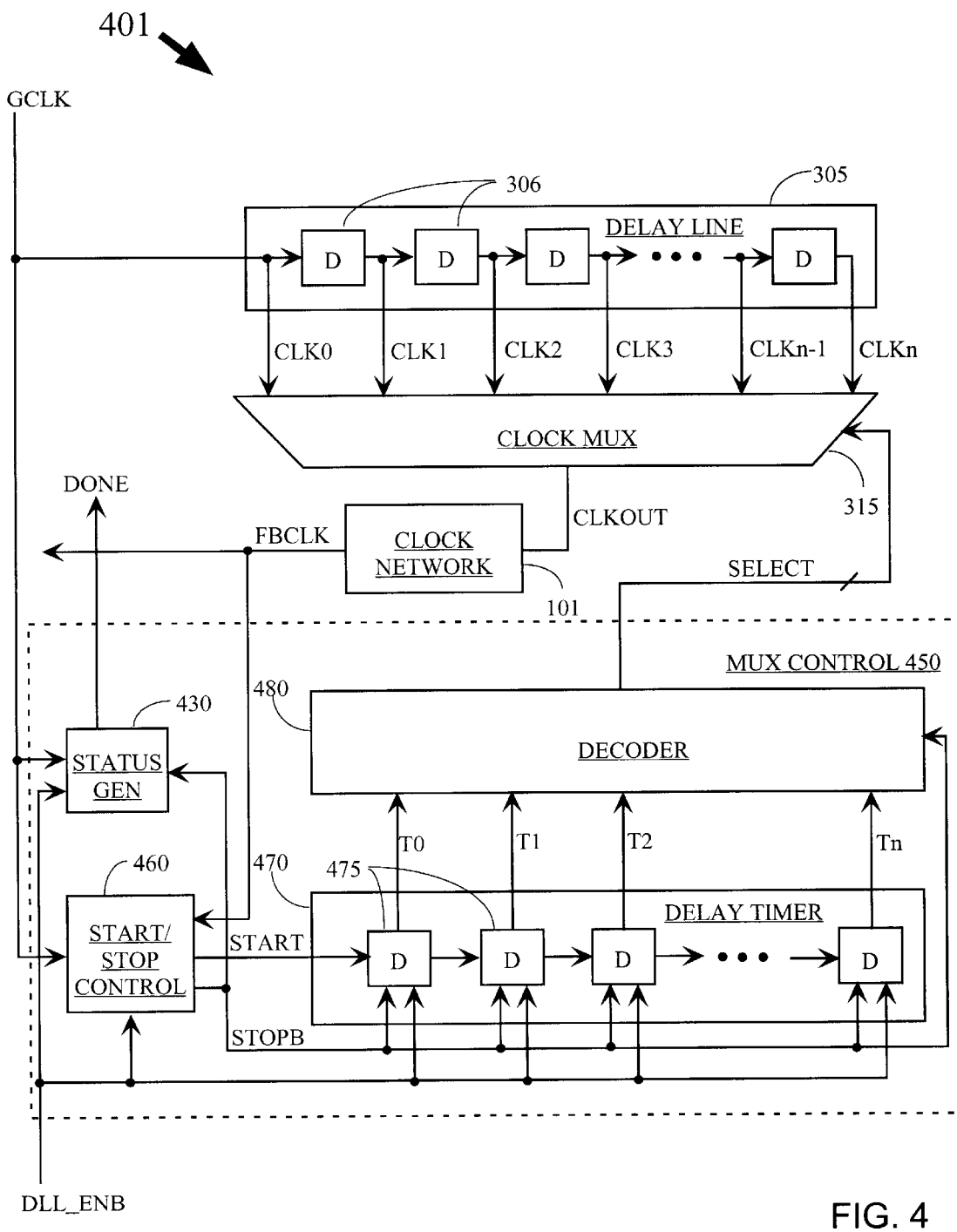
FIG. 4 is a block diagram of a second embodiment of the invention.

FIG. 4 shows a second embodiment of the invention. The embodiment of FIG. 4 includes several optional features not included in the embodiment of FIG. 3. Although these features are all shown in a single embodiment, they can be separately used or omitted, and the resulting circuits fall within the spirit and scope of the invention. The invention includes these and other variations on the basic concepts described herein.

The block diagram shown in FIG. 4 is similar to that of FIG. 3, and therefore is not described in detail here, except where the embodiment of FIG. 4 differs from that of FIG. 3. However, logic blocks that were previously described only in terms of their function are shown in more detail in relation to this embodiment.

Figure 5A:
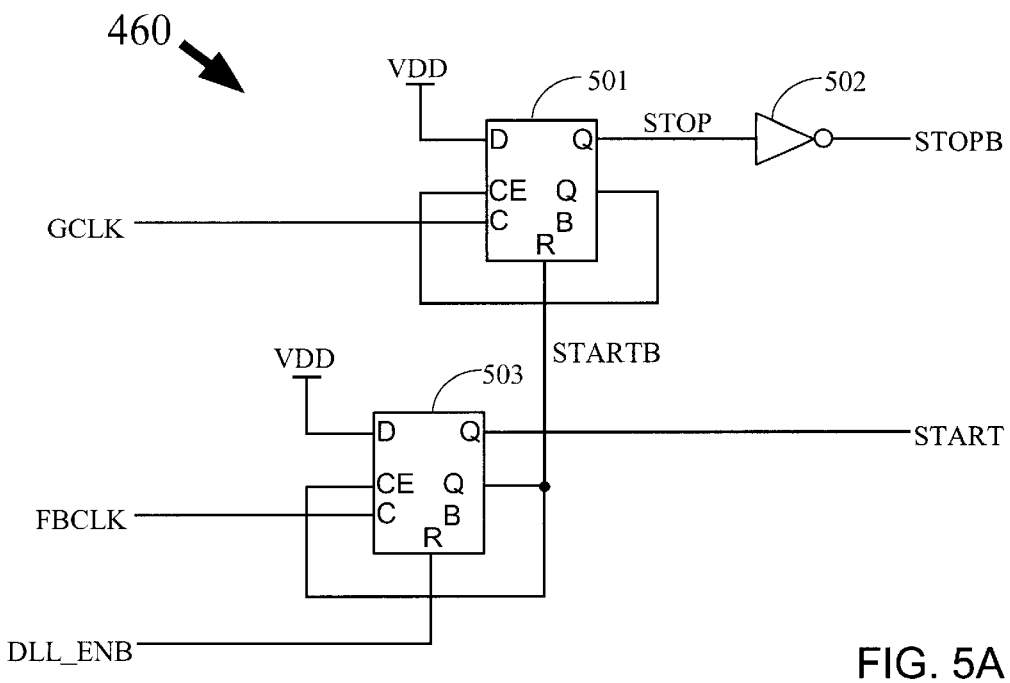
FIG. 5A is a block diagram of a Start/Stop control circuit that can be used with the embodiment of FIG. 4.

FIG. 5A is a block diagram of a Start/Stop control circuit that can be used with the embodiment of FIG. 4. Input signals to the control circuit include input clock signal GCLK, feedback clock signal FBCLK, and an enable/disable control signal DLL_ENB, which has several functions in the embodiment of FIG. 4. For example, enable/disable control signal DLL_ENB provides the reset function for the Start/Stop control circuit. Output signals from Start/Stop control circuit 460 are control signals STOPB and START, which control delay timer 470, decoder 480, and status generator 430.

Start/Stop control circuit 460 includes flip-flop 503, which provides control signal START from its non-inverting output terminal Q; flip-flop 501; and inverting buffer 502, which is driven by the non-inverted output terminal Q of flip-flop 501 (signal STOP) and provides control signal STOPB. The data input terminal D of each flip-flop 501, 503 is coupled to a fixed high voltage (VDD). The inverted output terminal QB of each flip-flop is coupled to its corresponding clock enable terminal. Therefore, when the flip-flop stores a high value, the clock terminal is effectively disabled and the value stored in the flip-flop does not change until the flip-flop is reset. Flip-flop 503 (providing the START signal) is clocked by feedback clock signal FBCLK. Flip-flop 501 (providing the STOPB signal) is clocked by input clock signal GCLK. Flip-flop 503 (providing the START signal) is reset by enable/disable control signal DLL_ENB. Flip-flop 501 (providing the STOPB signal) is reset by the signal STARTB, provided by the inverted output terminal QB of flip-flop 503. Therefore, when the value stored in flip-flop 503 (signal START) goes high (i.e., on the first rising edge of feedback clock signal FBCLK after enable/disable control signal DLL_ENB goes low), the value stored in flip-flop 501 (signal STOP) goes high on the next rising edge of input clock signal GCLK. Both flip-flops continue to store a high value until reset.

Figure 5B:
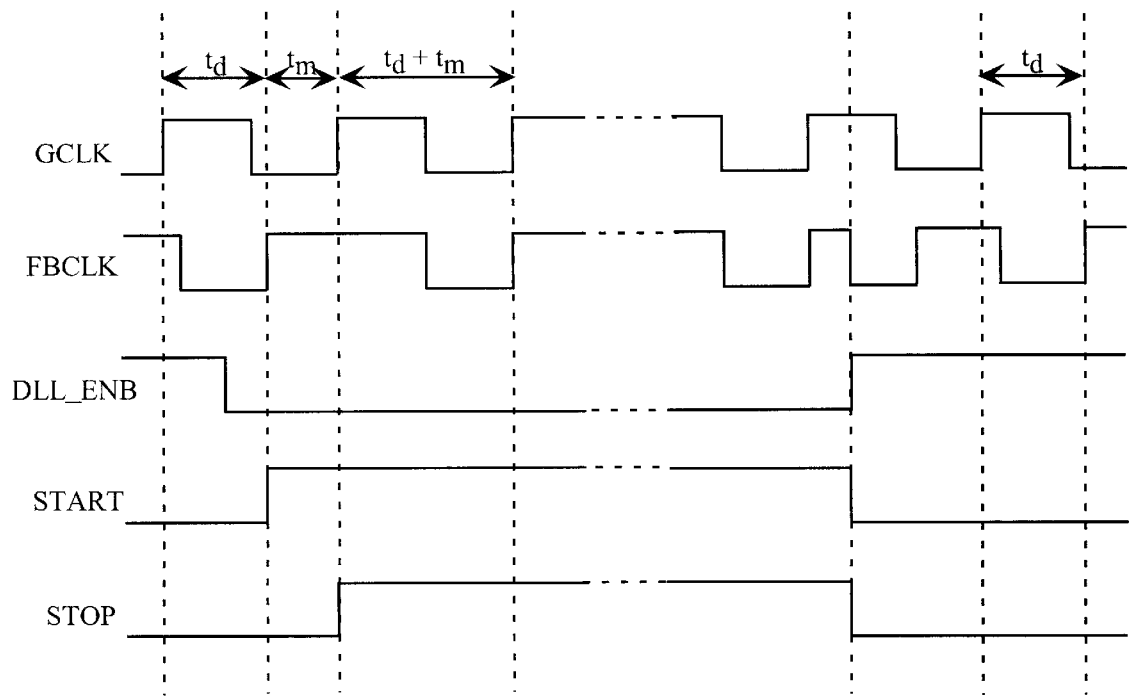
FIG. 5B is a timing diagram showing the interrelationships among the signals of the Start/Stop control circuit shown in FIG. 5A.

FIG. 5B is a timing diagram showing the interrelationships among the signals of the Start/Stop control circuit shown in FIG. 5A. When signal DLL_ENB is high, signals FBCLK and GCLK are ignored. When signal DLL_ENB goes low, the next rising edge of signal FBCLK results in signal START going high. On the next rising edge of signal GCLK, signal STOP goes high. Therefore, the delay between signal FBCLK going high and GCLK going high (labeled $t_m$ in FIG. 5B) is thus measured by the difference between the rising edges of the START and STOP signals. When signal DLL_ENB goes high again, both signals START and STOP are reset low, regardless of the state of signals FBCLK and GCLK.

Figure 6:
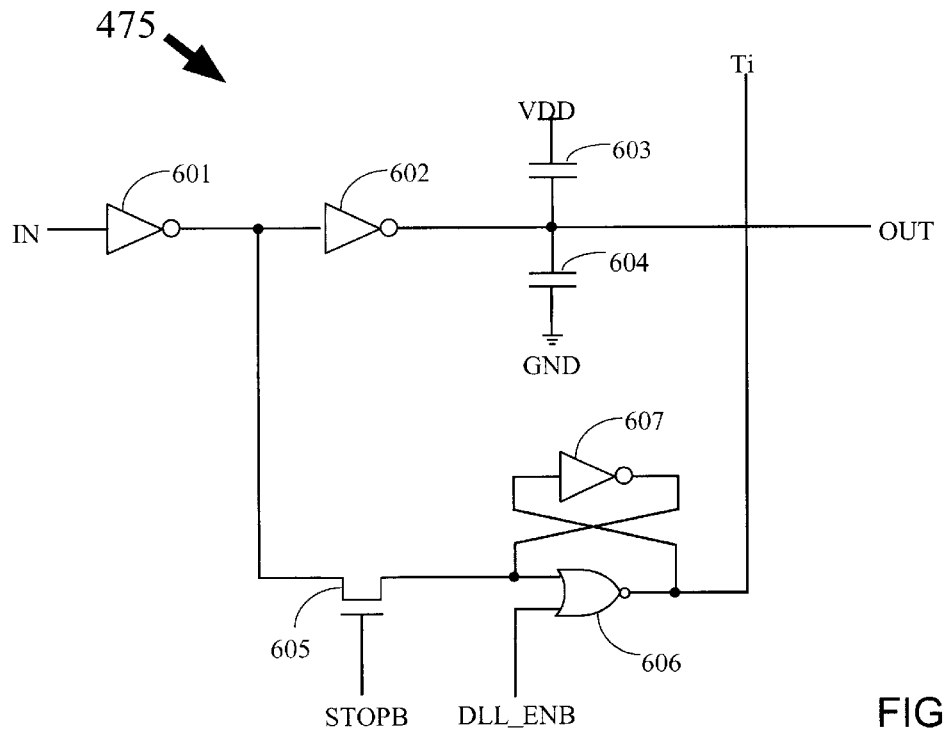
FIG. 6 is a block diagram of a delay element that can be used in the delay timer shown in FIG. 4.

FIG. 6 is a block diagram of a delay element 475 that can be used in delay timer 470 of FIG. 4. Input signal IN is delayed by inverters 601, 602 coupled in series, inverter 602 providing output signal OUT. Capacitor 603 provides a capacitance between output signal OUT and a fixed high voltage (VDD). Capacitor 604 provides a capacitance between output signal OUT and a fixed low voltage (GND). The values of capacitors 603 and 604 are selected such that the delay through delay element 475 is one unit delay, as described above. In one embodiment, the values of capacitors 603 and 604 are programmable, or otherwise adjustable.

The output terminal of inverter 601 is coupled to a first data terminal of a passgate 605, which is controlled by control signal STOPB. The second data terminal of passgate 605 is coupled to a first input terminal of NOR-gate 606 and an output terminal of inverter 607. NOR-gate 606 and inverter 607 are cross-coupled to form a latch. A second input terminal of NOR-gate 606 is coupled to enable/disable control signal DLL_ENB. The output terminal of NOR-gate 606 provides a bit Ti to decoder 480, where i=0, 1, ... n (see FIG. 4).

Delay element 306 of delay line 305 is preferably implemented using inverters and capacitors similar to inverters 601, 602 and capacitors 603, 604, so that the delays are similarly affected by processing and other variations.

Decoder 480 and clock multiplexer 315 operate as described throughout the specification. Decoders and multiplexers are notoriously well-known. Therefore, detailed descriptions of these elements are not provided herein.

As described above, the embodiment of FIG. 4 uses an enable/disable control signal DLL_ENB. When signal DLL_ENB is low, DLL circuit 401 is enabled, and provides an output clock signal CLKOUT such that the feedback clock signal FBCLK is synchronized with input clock signal GCLK. When control signal DLL_ENB is high, the DLL circuit is disabled, and provides an unaltered output clock signal CLKOUT.

Figure 7:
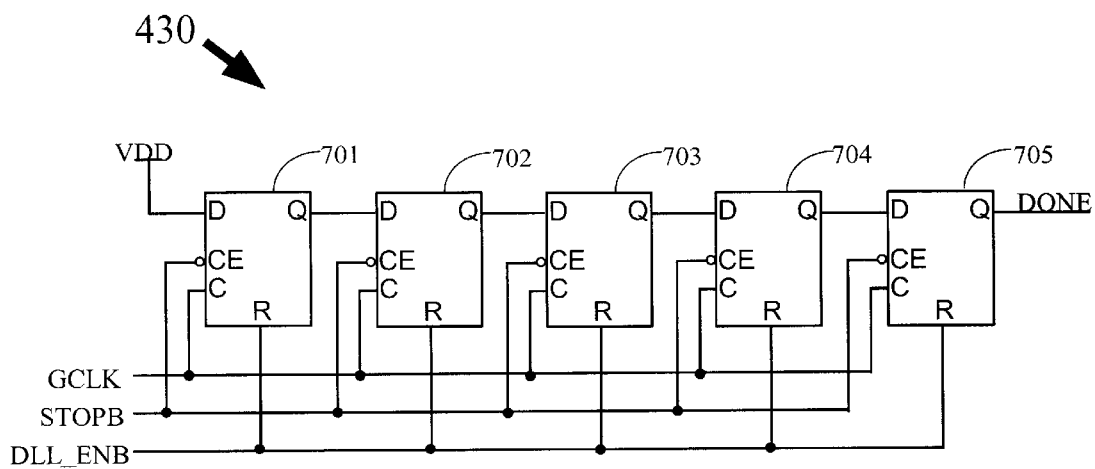
FIG. 7 is a block diagram of a status generator circuit that can be used in the embodiment of FIG. 4.

The embodiment of FIG. 4 also includes a status generator circuit 430 that provides a status signal DONE after a predetermined number of input clock cycles have elapsed. FIG. 7 shows an example of such a status circuit. Status generator circuit 430 includes a plurality of flip-flops 701–705 coupled in series and clocked by the input clock signal GCLK. The data input terminal D of the first flip-flop is coupled to a high voltage (VDD). The flip-flops are reset by a high value on the DLL_ENB signal, and enabled by a low value on the STOPB signal. Therefore, when the DLL circuit is first enabled, all flip-flops store a low value, and status signal DONE is low. Status signal DONE is optionally used by other circuits to disable the output clock signal CLKOUT until the output clock signal has settled into a reliably predictable pattern. The number of flip-flops in status generator circuit 430 can be any integer, depending on the anticipated number of clock cycles required for the output clock signal to settle.

On the first rising edge of the GCLK signal, flip-flop 701 goes high. On each succeeding edge, one more flip-flop goes high. After five rising edges on input clock signal GCLK, the status signal DONE goes high. If the STOPB signal goes high (and remains high) after less than five clock cycles, then DONE does not go high. In other embodiments, the status generator circuit is omitted or is otherwise implemented, for example, using a counter.

Those having skill in the relevant arts of the invention will now perceive various modifications and additions that may be made as a result of the disclosure herein. For example, the above text describes the invention in the context of ICs. However, the invention can also be applied to many other systems. Further, clock networks, delay elements, unit delays, delay lines, delay timers, multiplexers, decoders, status generators, and control circuits other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A delay-lock loop (DLL) circuit coupled to a clock network, the DLL circuit comprising:
   an input clock terminal providing an input clock signal;
   a feedback clock terminal providing a feedback clock signal from the clock network;
   a delay line driven by the input clock signal and providing a plurality of intermediate clock signals delayed from the input clock signal by incremental unit delays;
   a multiplexer control circuit driven by the input clock signal and the feedback clock signal;
   a clock multiplexer selecting among the intermediate clock signals under control of the multiplexer control circuit to provide a selected clock signal to the clock network, the selected clock signal being an intermediate clock signal subject to a selected delay about equal to an additional delay needed to bring the feedback clock signal into synchronization with the input clock signal; and
   an enable/disable control terminal coupled to the multiplexer control circuit and providing an enable/disable control signal thereto, and wherein:

when the enable/disable control signal is at a first logic level, the clock multiplexer circuit provides an output clock signal delayed by the selected delay, and when the enable/disable control signal is at a second logic level, the clock multiplexer circuit provides an output clock signal without inserting the selected delay.

2. The DLL circuit of claim 1, further comprising a status generation circuit driven by the input clock signal and providing a status signal, the status signal indicating when a predetermined number of input clock periods have elapsed since the DLL circuit was enabled.

3. A delay-lock loop (DLL) circuit coupled to a clock network, the DLL circuit comprising:

an input clock terminal providing an input clock signal;

a feedback clock terminal providing a feedback clock signal from the clock network;

a delay line driven by the input clock signal and providing a plurality of intermediate clock signals delayed from the input clock signal by incremental unit delays;

a multiplexer control circuit driven by the input clock signal and the feedback clock signal; and a clock multiplexer selecting among the intermediate clock signals under control of the multiplexer control circuit to provide a selected clock signal to the clock network, the selected clock signal being an intermediate clock signal subject to a selected delay about equal to an additional delay needed to bring the feedback clock signal into synchronization with the input clock signal, wherein the multiplexer control circuit comprises:

a delay timer comprising a series of delay elements each having a delay equal to the incremental unit delays of the delay line, the delay timer providing a series of bits indicative of the number of unit delays to be included in the selected delay; and a decoder that receives the series of bits and provides therefrom a plurality of select signals for controlling the clock multiplexer.

4. The DLL circuit of claim 3, wherein:

the multiplexer control circuit further comprises a start/stop control circuit, the start/stop control circuit providing to the delay timer a first signal responsive to a first edge of the feedback clock signal, and a second signal responsive to a second edge of the input clock signal, the second edge being a transition in the same direction as the first edge; and the first and second signals enable the delay timer to count a number of unit delays between the first and second edges.

5. A method of synchronizing a feedback clock signal from a clock network with an input clock signal, the method comprising:

receiving the feedback clock signal;

receiving the input clock signal;

providing from the input clock signal a plurality of intermediate clock signals delayed from the input clock signal by incremental unit delays;

selecting from among the intermediate clock signals a selected clock signal, the selected clock signal being an intermediate clock signal subject to a selected delay about equal to an additional delay needed to bring the feedback clock signal into synchronization with the input clock signal;

providing the selected clock signal to the clock network;

providing an enable/disable control signal;

when the enable/disable control signal is at a first logic level, providing an output clock signal delayed by the selected delay; and when the enable/disable control signal is at a second logic level, providing an output clock signal without inserting the selected delay.

6. The method of claim 5, further comprising providing a status signal, the status signal indicating when a predetermined number of input clock periods have elapsed since the enable/disable control signal was changed to the first logic level.

7. A method of synchronizing a feedback clock signal from a clock network with an input clock signal, the method comprising:

receiving the feedback clock signal;

receiving the input clock signal;

providing from the input clock signal a plurality of intermediate clock signals delayed from the input clock signal by incremental unit delays;

selecting from among the intermediate clock signals a selected clock signal, the selected clock signal being an intermediate clock signal subject to a selected delay about equal to an additional delay needed to bring the feedback clock signal into synchronization with the input clock signal; and providing the selected clock signal to the clock network, wherein selecting from among the intermediate clock signals a selected clock signal comprises:

counting a number of unit delays to be included in the selected delay; and decoding the number of unit delays to select from among the intermediate clock signals the selected clock signal.

8. The method of claim 7, wherein counting the number of unit delays to be included in the selected delay comprises:

providing a first control signal responsive to a first edge of the feedback clock signal;

providing a second control signal responsive to a second edge of the input clock signal, the second edge being a transition in the same direction as the first edge; and counting a number of unit delays between the first and second edges.

9. A delay-lock loop (DLL) circuit coupled to a clock network, the DLL circuit comprising:

means for receiving a feedback clock signal from the clock network;

means for receiving an input clock signal;

means for providing from the input clock signal a plurality of intermediate clock signals delayed from the input clock signal by incremental unit delays;

means for selecting from among the intermediate clock signals a selected clock signal, the selected clock signal being an intermediate clock signal subject to a selected delay about equal to an additional delay needed to bring the feedback clock signal into synchronization with the input clock signal;

means for providing the selected clock signal to the clock network;

means for providing an enable/disable control signal;

means for providing, when the enable/disable control signal is at a first logic level, an output clock signal delayed by the selected delay; and means for providing, when the enable/disable control signal is at a second logic level, an output clock signal without inserting the selected delay.

10. The DLL circuit of claim 9, further comprising means for providing a status signal, the status signal indicating when a predetermined number of input clock periods have elapsed since the enable/disable control signal was changed to the first logic level.

11. A delay-lock loop (DLL) circuit coupled to a clock network, the DLL circuit comprising:

means for receiving a feedback clock signal from the clock network;

means for receiving an input clock signal;

means for providing from the input clock signal a plurality of intermediate clock signals delayed from the input clock signal by incremental unit delays;

means for selecting from among the intermediate clock signals a selected clock signal, the selected clock signal being an intermediate clock signal subject to a selected delay about equal to an additional delay needed to bring the feedback clock signal into synchronization with the input clock signal; and means for providing the selected clock signal to the clock network;

wherein the means for selecting from among the intermediate clock signals a selected clock signal comprises:

means for counting a number of unit delays to be included in the selected delay; and means for decoding the number of unit delays to select from among the intermediate clock signals the selected clock signal.

12. The DLL circuit of claim 11, wherein the means for counting the number of unit delays to be included in the selected delay comprises:

means for providing a first control signal responsive to a first edge of the feedback clock signal;

means for providing a second control signal responsive to a second edge of the input clock signal, the second edge being a transition in the same direction as the first edge; and means for counting a number of unit delays between the first and second edges.

\* \* \* \* \*